United States Patent [19]
Hunt

[11] Patent Number: 5,757,873
[45] Date of Patent: May 26, 1998

[54] DIFFERENTIAL DELAY BUFFER

[75] Inventor: Kenneth Stephen Hunt, Camberley, United Kingdom

[73] Assignee: LSI Logic Corporation, Milpitas, Calif.

[21] Appl. No.: 466,384

[22] Filed: Jun. 6, 1995

[30] Foreign Application Priority Data

Jan. 20, 1995 [GB] United Kingdom ............... 9501124

[51] Int. Cl.⁶ .................................................. H03D 3/24
[52] U.S. Cl. ................................... 375/373; 327/65
[58] Field of Search .................. 307/446; 328/150; 332/19; 327/63, 65, 67, 73, 78, 79; 375/373

[56] References Cited

U.S. PATENT DOCUMENTS

| | | | |
|---|---|---|---|
| 3,579,150 | 5/1971 | Badessa | 332/19 |
| 3,916,328 | 10/1975 | Wilson | 328/150 |
| 4,535,294 | 8/1985 | Ericksen et al. | 328/150 |
| 4,839,541 | 6/1989 | Gal et al. | |
| 5,250,856 | 10/1993 | Burton et al. | 307/446 |

FOREIGN PATENT DOCUMENTS 1286343  8/1972  United Kingdom .

Primary Examiner—Stephen Chin
Assistant Examiner—Joseph Roundtree
Attorney, Agent, or Firm—Katz & Cotton, LLP

[57] ABSTRACT

A differential delay buffer includes a variable delay buffer unit, the variable delay buffer unit having a differential stage followed by a variable hysteresis stage. A plurality of variable delay buffer units can be cascaded together, in each variable delay buffer units a part of the required delay being effected. The variable hysteresis stage is responsive to the signal level at a second differential stage output to recover the signal at a first differential signal output from the variable delay buffer unit and is responsive to the signal level at a first differential stage output to recover the signal at the second delayed differential signal output for the variable delay buffer unit. The differential delay buffer can be included in a delay locked loop in data transmission applications.

5 Claims, 7 Drawing Sheets

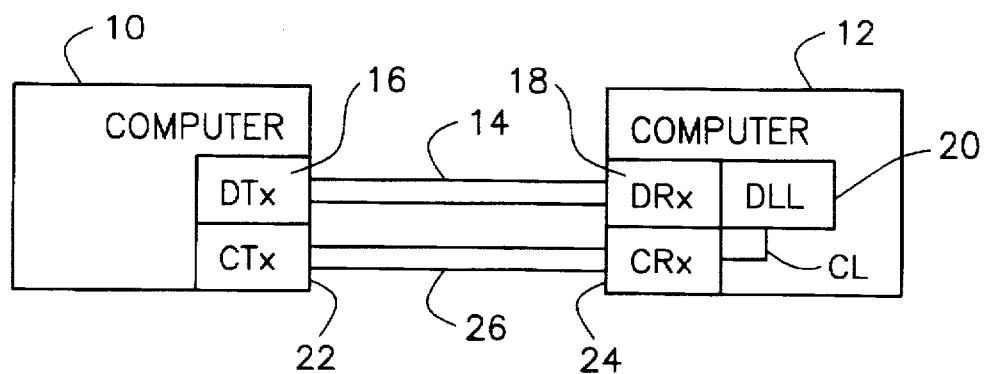
FIG. 1
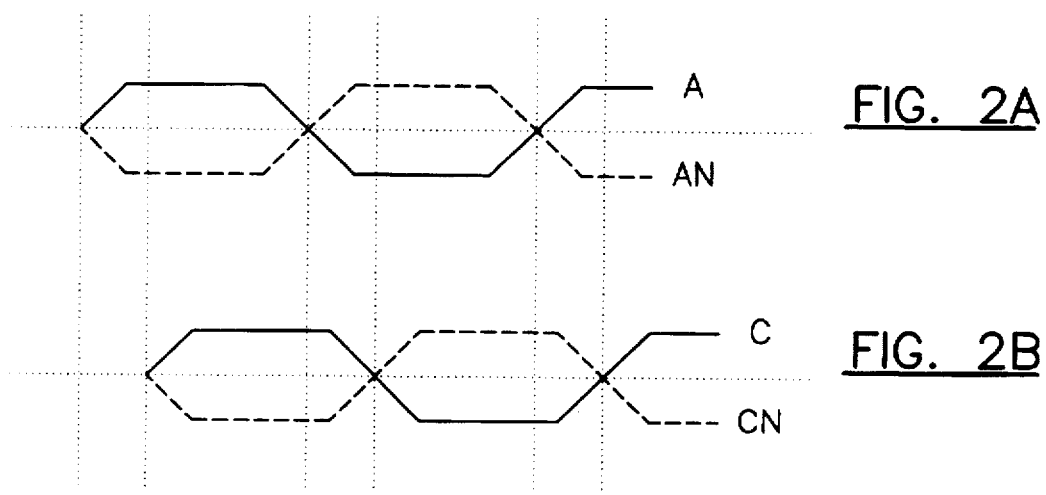
FIG. 2A
FIG. 2B
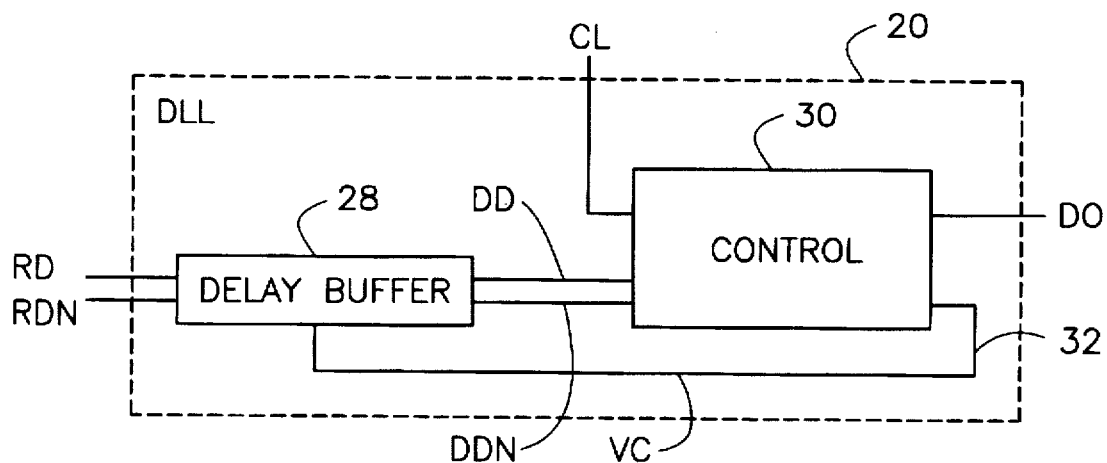
FIG. 3 (PRIOR ART)

5,757,873

DIFFERENTIAL DELAY BUFFER

CROSS REFERENCE TO RELATED PATENT APPLICATION

This patent application is related to and claims foreign priority under 35 U.S.C. §119 of United Kingdom patent application No. 9501124.3, filed Jan 20, 1995.

BACKGROUND OF THE INVENTION

1. Field of Invention

The invention relates to a differential delay buffer and, more particularly, to a delay locked loop, a digital system and an integrated circuit including such a buffer and to a method of delaying recovered differential signals.

2. Discussion of the Related Art

It is known to transmit differential digital data (normally binary) signals via line pairs, for example twisted line pairs between digital equipment, for example between computers or parts of a computer system. As well as data signals, clock signals are typically also sent via a differential line pair.

FIG. 1 of the accompanying drawings illustrates an example of an interconnection between a first computer 10 and a second computer 12 via a data line pair 14 and a clock line pair 26. The first computer 10 includes a data transmitter DTx 16 for transmitting differential binary signals via a first paired cable 14 to a data receiver DRx 18 at the second computer 12 and a clock transmitter CTx 22 for transmitting differential binary signals via the second paired cable 26 to a clock receiver CRx 24 at the second computer 12.

FIG. 2A of the accompanying drawings is a schematic representation of an example of a differential data signal A and AN which might be recovered from the first line pair 14 by the data receiver DRx 18 and FIG. 2B of the accompanying drawings is a schematic representation of an example of a differential clock signal C and CN which might be recovered from the second line pair 26 by the clock receiver CRx 24.

FIGS. 2A and 2B illustrate, by means of the vertical dotted lines that the received data signals A,AN and clock signals C,CN will typically not be in phase on being recovered from the data line pairs 14 and 26. This can result from differences in the processing delays of the data and clock receivers DRx 18 and CRx 24, but more typically it is as a result of transmission delays, due for example to the parasitic capacitance of the data and transmission lines 14 and 26 and the different frequencies of the clock and data signals. Accordingly, as shown in FIG. 1, the data signals recovered from the first line pair 14 by the data receiver DRx 18 and the clock signals CL recovered from the second line pair 26 by the clock receiver CRx 24 are supplied to a delay locked loop 20 for aligning the data and clock signals.

Although not shown in FIG. 1, it will be appreciated that in order to permit two way communication between the computers 10 and 12, the computer 12 also includes data and clock transmitters corresponding to the data and clock transmitters DTx 16 and CTx 22 and the computer 10 also includes data and clock receivers and a delay locked loop corresponding to the data and clock receivers DRx 16 and CRx 22 and the delay locked loop 20.

FIG. 3 of the accompanying drawings illustrates a conventional delay locked loop comprising a delay buffer 28 for receiving recovered differential data signals RD and RDN from a data receiver such as the data receiver DRx 18, the delay buffer 28 applying a variable delay to the recovered differential signals RD and RDN in accordance with a control voltage supplied on line 32 to generate delayed differential data signals DD and DDN. The control voltage VC is generated by control logic 30 in dependence upon the difference in timing between the clock signals CL received from a clock receiver such as the clock receiver CRx 24 and the delayed differential data signals DD and DDN received from the delay buffer 28. The clock signals CL may be single ended clock signals, for example the signal recovered from the clock signal C or may be a differential signal, for example the signals recovered from the differential clock signals C and CN.

Typically the delay buffer includes a chain of delay buffer units, each of which is responsive to the control voltage VC to control a delay applied to signals passing along the chain. FIG. 4 of the accompanying drawings illustrates a number of delay buffer units of an example of a conventional differential delay buffer, in this example a series of comparator/inverters 34, each of which is connected via current sources 36 to ground and supply voltage lines VSS and VDD. The dashed representations of capacitors 38 represent the parasitic capacitances between the comparator/inverter stages. In the conventional delay buffer, the delay which is applied by the comparator/inverter stages 34 is controlled in response to the control voltage VC from the line 32 by current limiting output transistors (not shown) of the comparator/ inverter stages 34 such that the output transistors are effectively slowed down.

Although FIG. 4 represents part of a conventional differential delay buffer, it is to be noted that current limiting of the output transistors is also applied in single ended buffers.

The main disadvantage of the prior art approach is that the delay the data signals which results is not solely a function of the control voltage, but is also data dependent. FIG. 5 of the accompanying drawings is a simplified equivalent circuit representation of the delay buffer shown in FIG. 4. In particular FIG. 5 illustrates that the effect of current limiting the output transistor(s) is effectively to change the impedance of the output circuit. As the parasitic capacitance is dependent on signal frequency, the effective result is a frequency dependent circuit.

By slowing down the output transistor in order to effect the delay timing, the maximum operating frequency of the delay buffer is consequently reduced. The reasons for this will be explained with reference to FIG. 6 of the accompanying drawings.

FIG. 6a represents an idealized square wave. FIG. 6b represents the effect of delaying a low frequency square wave by means of the circuit of FIGS. 4/5. It will be noted that some rounding of the signal results. FIG. 6c represents the effect of delaying a high frequency square wave by means of the circuit of FIGS. 4/5. It is to be noted that the rounding of the signal is complete. It should also be noted when referring to FIG. 6 that the waveforms are not to scale in the horizontal time dimension and that the actual curves shown are merely schematic. Thus, FIG. 6c is intended to represent a signal of a much higher frequency than that of FIG. 6b. FIG. 6d is intended to indicate that at even higher frequencies the signals may not even reach full potential before the next transition occurs, for example at T1 or T2. As a result signal integrity can be lost.

Although the clock frequency should be constant, the data frequency is in fact data dependent. For example, a data sequence 01010101 for the signals A and AN of FIG. 2A has twice the frequency of the data sequence 00110011 as there are twice the number of transitions. Thus in operation of a conventional delay buffer, fluctuations in the degree of alignment of the clock and data signal timings and a possible loss of data integrity can occur as a result of the data content of the data signal. This problem is becoming more significant as the data transmission rate requirements increase.

SUMMARY OF THE INVENTION

It is therefore an object of the present invention to overcome, or at least to mitigate the problems of prior art delay buffers.

In accordance with a first aspect of the invention, there is provided a differential variable delay buffer comprising a variable delay buffer unit, the variable delay buffer unit comprising a differential stage followed by a variable hysteresis stage.

By the provision of the differential stage followed by the variable hysteresis stage the differential signals may be buffered and then restored after an accurately controllable delay. An embodiment of a differential delay buffer in accordance with the invention allows for the accurate control in a data independent manner of the delay of differential signals, even at frequencies in the GHz region. The speed of a buffer circuit in accordance with the invention is not in itself changed when adjusting a control voltage, merely the delay is changed. The provision of the hysteresis maintains signal integrity when delaying a datastream making the invention ideal for cascaded applications in delay locked loops and clock/data recovery circuits.

Preferably, the buffer comprises a plurality of variable delay buffer units cascaded together, in each variable delay buffer units a part of the required delay is effected.

In an embodiment of the invention the variable delay buffer unit has first and second differential signal inputs and first and second delayed differential signal outputs, the differential stage having first and second differential stage inputs connected to the first and second differential signal inputs and first and second differential stage outputs connected to the first and second delayed differential signal outputs. In this embodiment the variable hysteresis stage is connected between the first and second differential stage outputs and the first and second delayed differential signal outputs.

Preferably the variable hysteresis stage comprises means responsive to the signal level at the second differential stage output to recover the signal at the first differential signal output and means responsive to the signal level at the first differential stage output to recover the signal at the second delayed differential signal output.

In a preferred embodiment of the invention the variable hysteresis stage comprises a first recovery transistor connected between the first delayed differential signal output and a first variable current source, a gate of the first recovery transistor being connected to the second differential stage output, and a second recovery transistor connected between the second delayed differential signal output and a second variable current source, a gate of the second recovery transistor being connected to the first differential stage output. The first and second variable current sources are preferably formed by a current source transistor (e.g. a FET) connected between the recovery transistors and a first voltage supply, a gate of the current supply transistor being connected to receive a delay control signal, more preferably by a common, first, current source transistor.

Thus it is the hysteresis of the variable delay buffer which is controlled by the control voltage. As more hysteresis is added the delay increases. By adding hysteresis the signal is effectively regenerated maintaining signal integrity even at high frequencies. A wide dynamic range in the 3:1 range can thus be achieved.

Preferably the differential buffer stage comprises a differential comparator stage. In a preferred embodiment of the invention the differential stage comprises a first comparator transistor having a gate connected to a first differential signal input and a second comparator transistor having a gate connected to a second differential signal input, the first comparator transistor being connected via a second current source transistor to a second voltage supply (e.g., a 3 volt supply line), the second comparator transistor being connected via a third current source transistor to the second voltage supply and the first and second comparator transistors being connected via a fourth current source transistor to a first voltage supply (e.g., a 0 volt supply line).

The invention also provides a delay locked loop comprising a differential delay buffer as defined above and a control unit, the control unit being connected to receive first and second delayed differential outputs from the differential delay buffer and a reference timing signal for generating a delay control signal for controlling the delay of the variable hysteresis stage of a the variable delay unit.

The invention further provides a digital system comprising a differential data signal receiver, a differential clock signal receiver and a delay locked loop as defined above, the differential delay buffer being connected to receive recovered differential data signals from the differential data signal receiver and the control unit being connected to receive recovered differential clock signals from the differential clock signal receiver.

The differential delay buffer, possibly with the other features of the delay locked loop, can be implemented in an integrated circuit. The integrated circuit can additionally comprise a differential data signal receiver and a differential clock signal receiver, the differential delay buffer being connected to receive recovered differential data signals from the differential data signal receiver and the control unit being connected to receive recovered differential clock signals from the differential clock signal receiver.

In accordance with a further aspect of the invention there is provided a method of delaying recovered differential signals, the method comprising, in one or more cascaded variable delay buffer units:

buffering the recovered signals in a differential stage; and
subsequently applying variable hysteresis to the buffeted signals.

Other objects, features and advantages of the invention will become apparent in light of the following description thereof.

BRIEF DESCRIPTION OF THE DRAWINGS

FIG. 1 is a example of an application of the present invention for the communication of data in a data processing system;

FIGS. 2A and 2B are schematic representations of differential signals data and clock signals as recovered at receiving equipment in the system of FIG. 1;

FIG. 3 is a schematic block diagram of a delay locked loop;

DETAILED DESCRIPTION OF THE INVENTION

Figure 4:
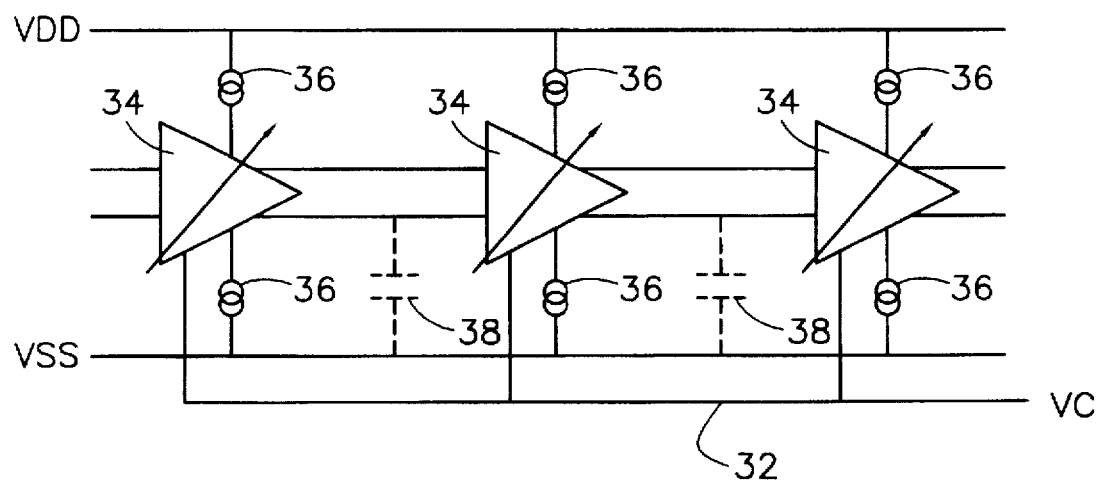
FIG. 4 is a schematic diagram of a part of a conventional delay buffer.
Figure 5:
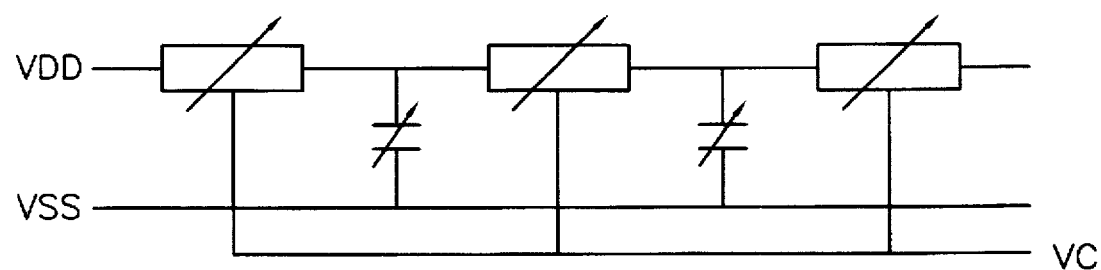
FIG. 5 is a schematic equivalent circuit of the delay buffer of FIG. 4.
Figure 6:
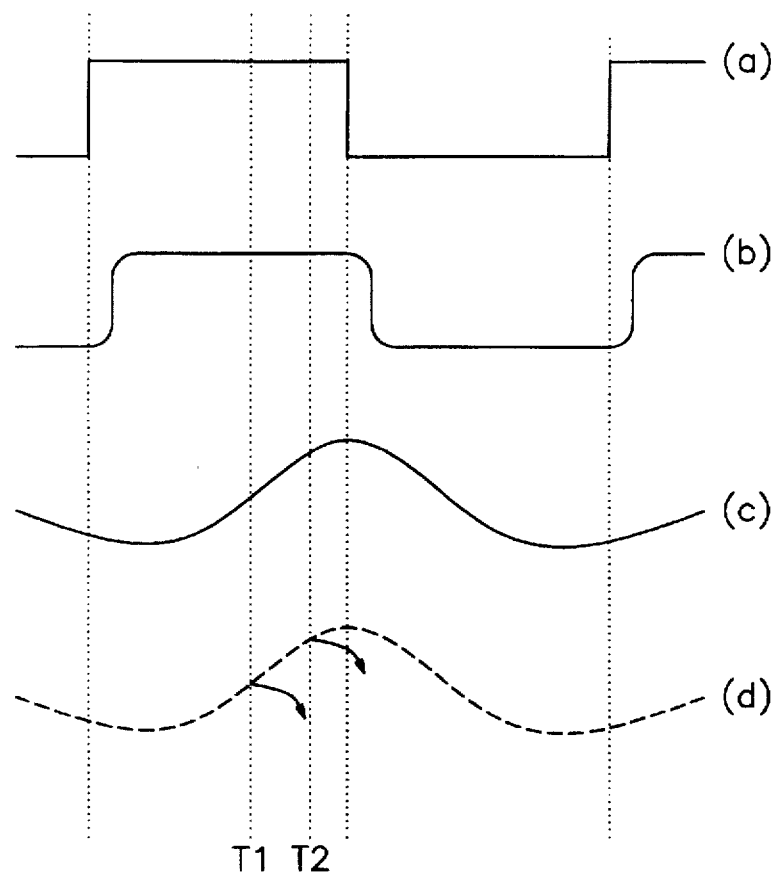
FIGS. 6a–6d represent delayed signal waveforms at different frequencies.
Figure 7:
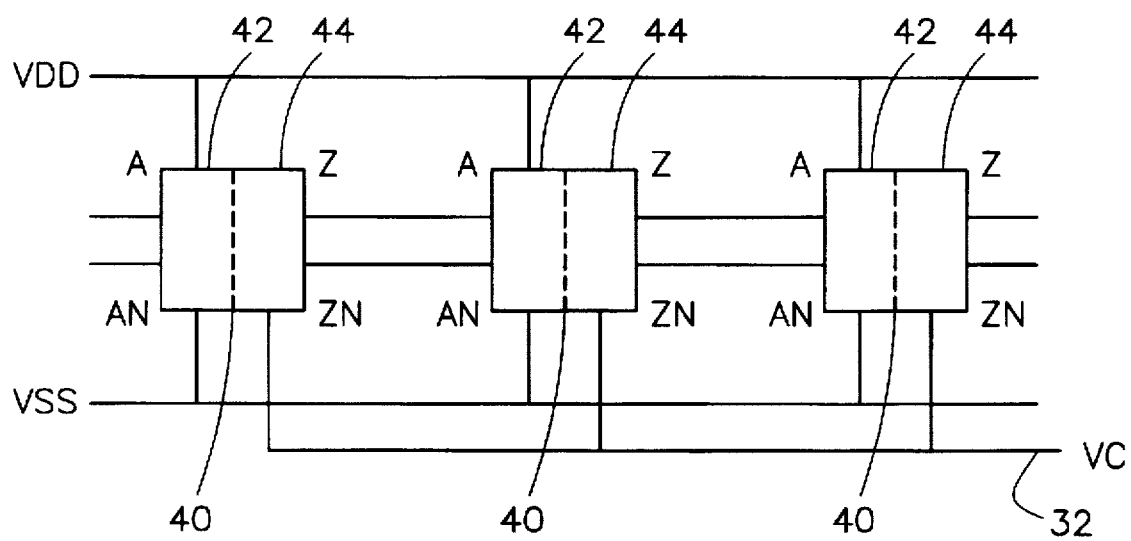
FIG. 7 is a schematic block diagram of an example of the present invention.

FIG. 7 is a schematic block diagram of an example of part of delay buffer in delay buffer in accordance with the invention. In particular FIG. 7 shows three variable delay buffer units 40 from a chain of such units of an example of a differential delay buffer in accordance with the invention. The number of variable delay buffer units will be chosen in accordance with system requirements, but will typically number significantly more than three units (e.g., from 8 to 32 units), although in a limit case the differential delay buffer might only include a single variable delay buffer unit 40.

Each variable delay buffer unit comprises a differential stage 42 followed by a variable hysteresis stage 44. Each variable delay buffer unit has first and second differential inputs A and AN and first and second delayed differential signal outputs Z and ZN.

Each variable delay buffer unit is connected to a first voltage supply VSS (here a first voltage supply line VSS typically connected in use to ground potential) and a second voltage supply VDD (here a second voltage supply line VDD typically connected in use to a positive voltage source, for example at 3 volts). A delay control line 32 (e.g., from a control unit 30 of FIG. 1) is also connected to each variable hysteresis stage 44.

Figure 8:
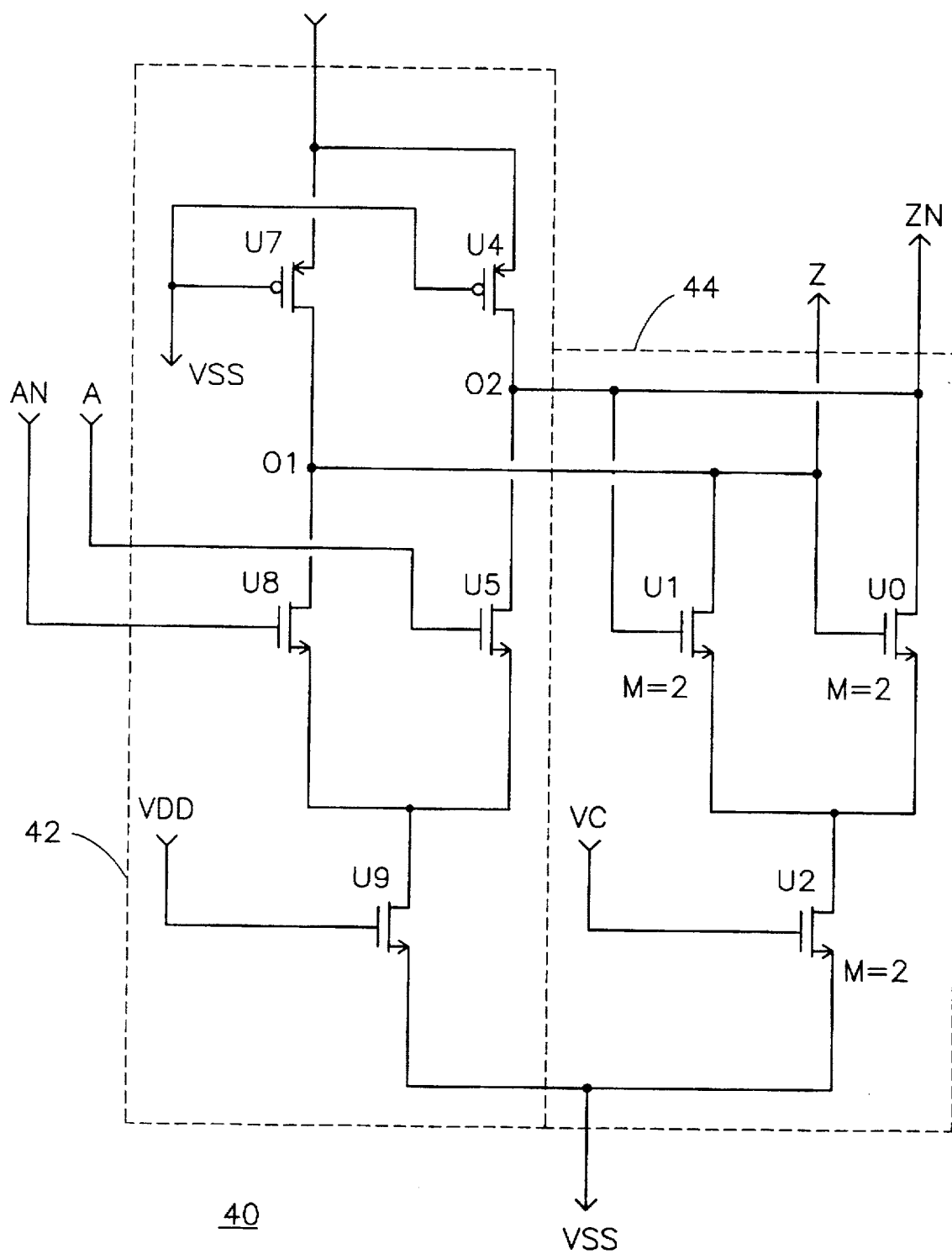
FIG. 8 is a circuit diagram of a variable delay buffer unit of an example of a delay buffer in accordance with the invention.

FIG. 8 is a circuit diagram of a variable delay buffer unit of an example of a delay buffer in accordance with the invention. The variable delay buffer unit comprises a differential stage within the dotted boundary line 42 and a variable hysteresis stage within the dotted boundary line 44.

The differential buffer stage 42, which is a differential comparator/inverter in the present embodiment, has first and second differential stage inputs formed by the gates of comparator transistors U5 and U8, respectively, connected to the first and second differential inputs A and AN. The differential stage also has first and second differential stage outputs, O1 and O2, respectively, connected to the first and second delayed differential signal outputs Z and ZN.

The first comparator transistor U5 (here an N-channel Field Effect Transistor (N-FET)) has its drain connected to the source of a current source transistor U4 (here a P-channel Field Effect transistor (P-FET)), the drain of which is connected to the second (e.g., a 3 volt) voltage supply line VDD. The second comparator transistor U8 (here an N-FET) has its drain connected to the source of a current source transistor U7 (here a P-FET), the drain of which is also connected to the second voltage supply VDD. The gates of the current source transistors U4 and U7 are connected to the first (e.g., a ground potential) voltage supply line VSS.

The drains of the first and second comparator transistors U5 and U8 are connected in common to the source of a current source transistor U9 (here an N-FET), the drain of which is connected to the first voltage supply line VSS. The gate of the current source transistor U9 is connected to the second voltage supply line VDD.

The first differential stage output O1 is defined at the junction between the drain of the second comparator transistor U8 and the source of the current supply transistor U7. The second differential stage output O2 is defined at the junction between the drain of the first comparator transistor U5 and the source of the current supply transistor U4. It can be seen, therefore that the differential stage 42 has the effect of buffering and inverting the input differential signals A and AN to generate outputs at O2 and O1, respectively. FIG. 9a and FIG. 9b illustrate the relationship between the input signals A/AN and the outputs at O2/O1 delayed by dt0. FIG. 9b illustrates the signals which would be output by the differential stage if no variable hysteresis stage were provided.

The variable hysteresis stage 44 is effectively connected between the first and second differential stage outputs O1 and O2 and the first and second delayed differential signal outputs Z and ZN. The variable hysteresis stage 44 is responsive to the signal level at the second differential stage output O2 to recover the signal at the first differential signal output Z and to the signal level at the first differential stage output O1 to recover the signal at the second delayed differential signal output ZN.

In particular, in this embodiment, the variable hysteresis stage 44 comprises a first recovery transistor U0 (here an N-FET), the drain of which is connected to the second delayed differential signal output ZN and the gate of which is connected to the first differential stage output O1 and a second recovery transistor U1 (here an N-FET), the drain of which is connected to the first delayed differential signal output Z and the gate of which is connected to the second differential stage output O2. It will be appreciated that, as a result of the connection of the first differential stage output O1 to the first delayed differential signal output Z and the connection of the second differential stage output O2 to the second delayed differential signal output ZN, the gate of first recovery transistor U0 is also connected to the first delayed differential signal output Z and the gate of second recovery transistor U1 is also connected to the second delayed differential signal output ZN.

The sources of the first and second recovery transistors U0 and U1 are connected in common to the drain of a variable current source transistor U2, the source of which is connected to the first voltage supply line VSS. The gate of the variable current source transistor U2 is connected to receive the delay control voltage VC, for example from a control unit 30 via a control line 32 as shown in FIG. 3.

Figure 9:
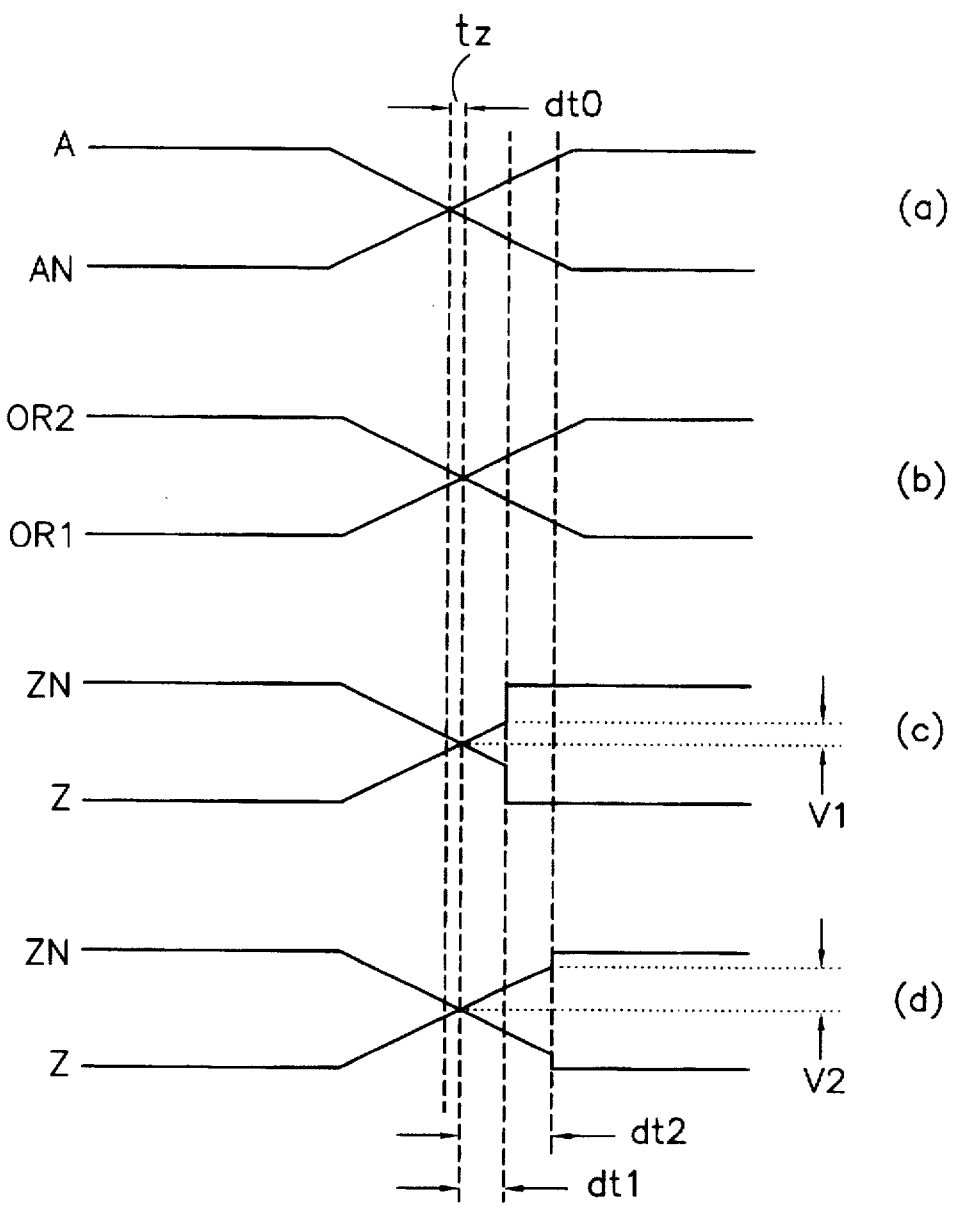
FIGS. 9a–9d are schematic waveforms illustrating the effect of the circuit of FIG. 8.

The effect of the variable hysteresis stage 44 is illustrated in the timing diagrams of FIG. 9.

By adjusting the control voltage VC to the gate of the variable current source transistor U2, the switching points of the recovery transistors can be adjusted. In particular, the larger the control voltage VC, the larger the voltage needed to switch the recovery transistors U0 and U1.

FIG. 9c represents the situation where a relatively small control voltage VC is provided to the variable current supply transistor U2. As a result of this the first and second recovery transistors U0 and U1 switch when the output from the second and first differential stage outputs O1 and O2, respectively, reaches a relatively modest voltage V1. This in turn means that the first and second recovery transistors U0 and U1 drive the second and first delayed differential signal outputs ZN and Z, respectively, to their full recovered values after a relatively short time dt1 following the zero crossing point tz.

FIG. 9d represents the situation where a relatively large control voltage VC is provided to the variable current supply transistor U2. As a result of this the first and second recovery transistors U0 and U1 switch when the output from the first and second differential stage outputs 01 and 02, respectively, reaches a relatively larger voltage V2. This in turn means that the first and second recovery transistors U0 and U1 drive the second and first delayed differential signal outputs ZN and Z, respectively, to their full recovered values after a relatively longer interval dt2 following the zero crossing point tz.

The speed of a variable delay buffer unit is not in itself changed when adjusting a control voltage, merely the delay is changed. The hysteresis of the variable delay buffer is controlled by the control voltage. As more hysteresis is added the delay increases. By adding hysteresis the signal is effectively regenerated maintaining signal integrity even at high frequencies. A wide dynamic range in the 3:1 range can thus be achieved. The hysteresis maintains signal integrity when delaying a datastream making the invention ideal for cascaded applications in delay locked loops and clock/data recovery circuits.

The invention enables accurate control of the signal delays independent of the data frequency and enables data integrity to be maintained even at high data frequencies. By positively driving the first and second delayed differential signal outputs Z and ZN to their recovered values, delay control is accurate, and the problems of signal rounding are avoided.

Embodiments of a differential delay buffer in accordance with the invention can be implemented in any suitable discrete or integrated technology. The differential delay buffer could be implemented on its own, or in combination with other circuitry in an integrated circuit. For example a delay locked loop as illustrated in FIG. 3 could be implemented in an integrated circuit with a delay buffer in accordance with the invention.

The invention finds particular application in high frequency differential data transmission applications.

Figure 10:
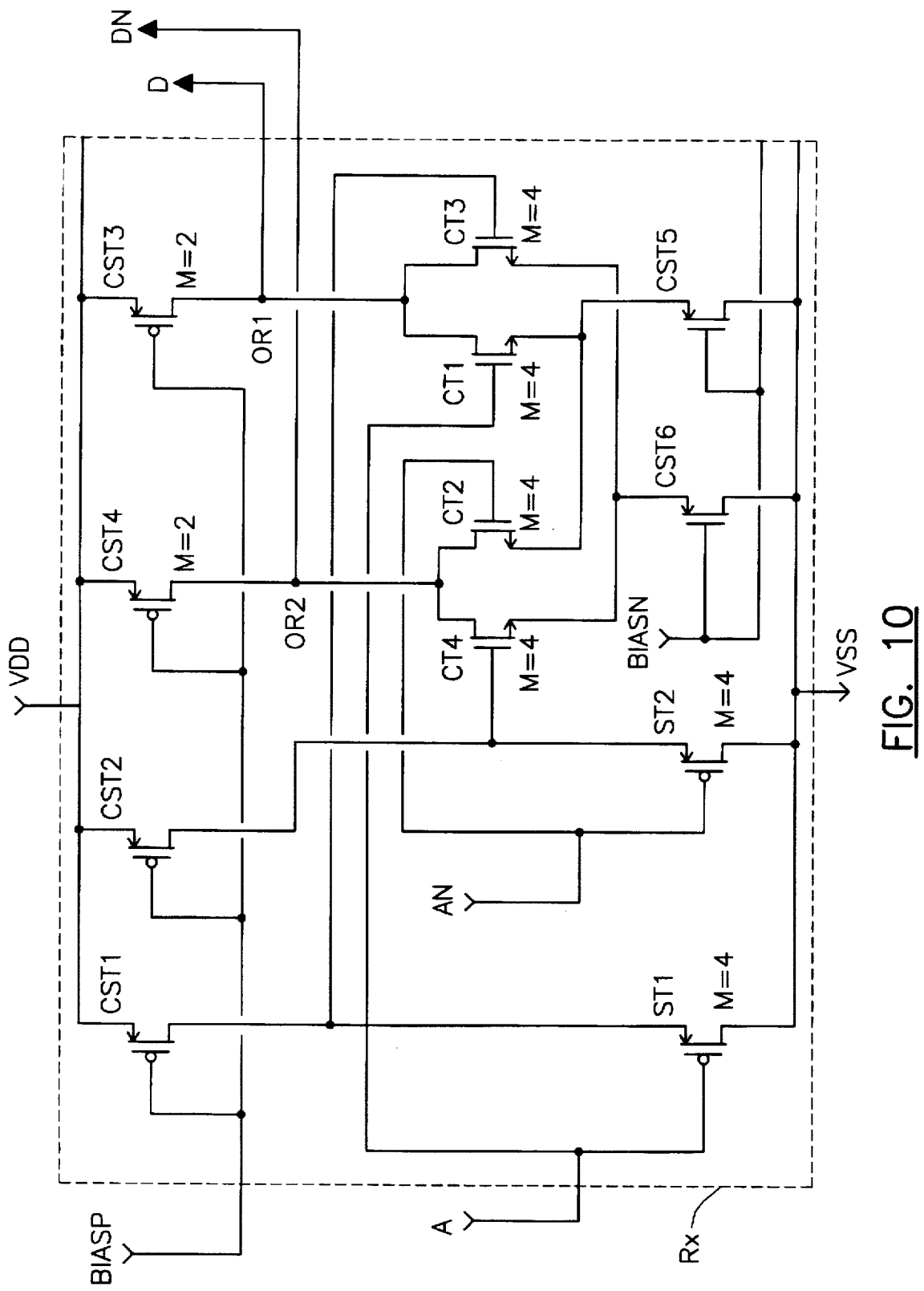
FIG. 10 is an example of a receiver circuit for use with the present invention.

One standard for the transmission of digital signals, the IEEE Standard for Low-Voltage Differential Signals for SCI "(LVDS)", draft 1.00 IEEE Std 1596.3-1994, December 1993, requires that differential transmission equipment transmits signals with differential voltages of +/−250 mV to +/−400 mV and a common mode voltage of 1.2 V, with a possible deviation of ±0.75 mV, and frequencies of up to 622 MHz. Reception equipment has to be capable of receiving these signals with an extended common mode range of between 0–2.4 V to take account of, for example, differences in the ground potential of different pieces of equipment. This standard sets high demands on the reception of data. FIG. 10 illustrates an example of a receiver circuit which could be used to implement the data receiver DRx and/or the clock signal receiver CRx of digital system including a delay locked loop and delay buffer in accordance with the invention. A receiver as illustrated in FIG. 10 forms the subject matter of commonly owned, co-pending UK patent application, No. 9501153.2, filed Jan.20, 1995, and corresponding U.S. patent application Ser. No. 08/467,849, entitled "Differential Signal Receiver "by Kenneth Stephen Hunt, filed Jun. 6, 1995, and incorporated by reference herein for all purposes.

The differential signal receiving circuit illustrated in FIG. 10 includes a shifting stage comprising first and second shifting transistors ST1 and ST2, (here PFETs). The gate of the first shifting transistor ST1 is connected to a first differential input A and the gate of the second shifting transistor ST2 is connected to a second differential input AN.

The source and drain of the first shifting transistor ST1 are connected to a second voltage supply VDD via a first current source transistor CST1, and to a first voltage supply VSS, respectively. The source and drain of the second shifting transistor ST2 are connected to the second voltage supply VDD via a second current source transistor CST2, and to the first voltage supply VSS, respectively.

A first shifted differential signal AA is provided at the junction between the first shifting transistor ST1 and the first current source transistor CST1 and a second shifted differential signal AAN is provided between the second shifting transistor ST2 and the second current source CST2.

The effect of the shifting stage is to apply a voltage offset to the input differential signals A and AN. The amount of the voltage offset, that is the amount by which the input differential signals A and AN are shifted to form the shifted signals AA and AAN vary normally with process variations but are normally in the range of 1.2 to 1.8 volts, more typically about 1.5 volts. The actual amount by which the input signals are shifted can generally be controlled in a manner which will be apparent to one skilled in the art by an appropriate configuring of the shifting transistors ST1 and ST2 and by configuring or controlling the current source transistors CST1 and CST2.

A first differential stage comprises a first comparator transistor CT1 (here an N-FET connected via a third current source transistor CST3 to the second voltage supply VDD and a second comparator transistor CT2 (here an N-FET) connected via fourth current source transistor CST4 to the second voltage supply VDD. The first and second comparator transistors, CT1 and CT2, are connected via a fifth current source transistor CST5 to the first voltage supply VSS.

The gate of the first comparator transistor CT1 is connected to the first differential input A and the gate of the second comparator transistor is connected to the second differential input AN.

A second differential stage comprises a third comparator transistor CT3 connected via the third current source transistor CST3 to the first voltage supply VDD and a fourth comparator transistor CT4 connected via the fourth current source transistor CST4 to the second voltage supply VDD. The third and fourth comparator transistors, CT3 and CT4, are connected via a sixth current source transistor CST6 to the first voltage supply VSS.

The gate of the third comparator transistor CT3 is connected to the first shifted differential signal AA and the gate of the fourth comparator transistor CT4 is connected to the second shifted differential signal AAN.

The gates of the current source transistors CST1-CST4 (here P-channel FETs) are connected to a common bias voltage BIASP. The gates of the fifth and sixth current source transistors CST5, CST6 (here N-FETs) are connected to a common bias voltage BIASN.

A summing stage is formed by the wired-OR connection OR1 of the junction between the first and third comparator transistors CT1 and CT3 and the third current source transistor CST3, and the wired-OR connection OR2 of the junction between the second and fourth comparator transistors CT2 and CT4 and the fourth current source transistor CST4.

Thus a first received binary differential signal RD is output from the junction OR1 between the first and third comparator transistors CT1 and CT3 and the third current source transistor CST3. A second received differential signal RDN is output from the junction OR2 between the second and fourth comparator transistors CT2 and CT4 and the fourth current source transistor CST4.

The effect of the wired-OR connections OR1 and OR2 of the first and second differential stages is to sum the differential currents generated in the first and second differential circuits in response to the normal and shifted differential input signals, respectively.

The circuit arrangement illustrated in FIG. 7 provides a simple, fast, reliable and cost effective solution to meeting the LVDS standard referred to above. The circuit performance exceeds that required by the LVDS standard and has been seen to operate reliably at frequencies exceeding 800 MHz, and approaching 1 GHz.

Where the receiver is a data receiver, the received differential data signals RD and RDN (FIG. 3) can then be supplied as the differential inputs to the differential delay buffer, possibly after further amplification. Where the receiver is a clock signal receiver, one or both of the received differential clock signals RD and RDN can then be supplied as the clock input(s) to the control unit 30 of FIG. 3.

The absolute sizes of the transistors in the circuits shown is not significant to an implementation of the present invention. The circuits may be implemented with any appropriate discrete, or preferably integrated technology. The M=X references in FIGS. 8 and 10 indicate preferred relationships between the sizes of the transistors and/or numbers of transistors if the circuit is implemented with discrete circuit elements (i.e., M=5 indicates a transistor five times the size of an M=1 transistor or that the transistor is formed by connecting five transistors in parallel).

Figure 11:
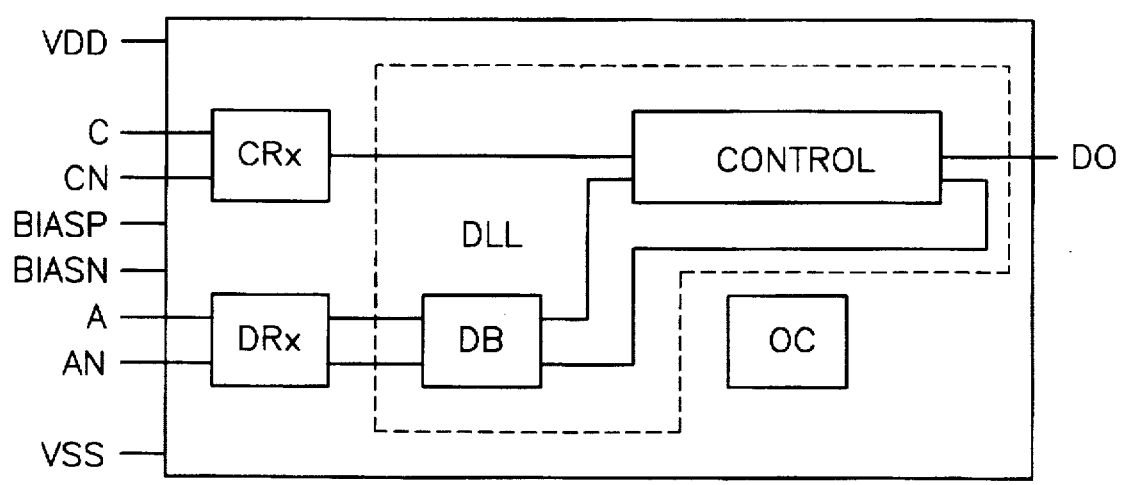
FIG. 11 is a schematic diagram of the configuration of an integrated circuit employing the present invention for incorporation in the system of FIG. 1.

FIG. 11 is a schematic illustration of an integrated circuit IC including data and clock receivers DTx and CTx and a delay locked loop DLL including a differential delay buffer DB in accordance with the invention and control logic CONTROL. The integrated circuit includes inputs for the differential data signals A and AN, the differential clock signals C and CN, the first and second voltage supplies VDD and VSS and the first and second bias voltages BIASP and BIASN. The integrated circuit can include an external output terminal for the delayed output signals DO of FIG. 3. The bias voltages BIASP and BIASN could be generated internally to the integrated circuit IC of FIG. 10, rather than being externally supplied as illustrated in FIG. 11. Thus, as well as the circuits described with reference to FIG. 11, the integrated circuit can include other signal processing circuitry OC as required, for example circuitry for processing the signal at the output DO of FIG. 3. The integrated circuit of FIG. 11 could additionally include transmitter circuits DTx and CTx for transmitting data signals.

For example, although in the present embodiment the invention is implemented using FET technology, other embodiments could be implemented on other circuit technology. Also, the circuit configurations could be changed in accordance with design preferences.

Although reference has been made to the LVDS standard and for circuits with a supply voltage VDD of 3 volts, it will be appreciated that the invention could be used in other applications and with other supply voltages.

The present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A differential variable delay buffer, comprising:

a variable delay buffer unit, said variable delay buffer having first and second differential signal inputs and first and second delayed differential signal outputs, wherein said variable delay buffer unit comprises:

a differential stage, said differential stage having first and second differential stage inputs connected to said first and second differential signal inputs and first and second differential stare outputs connected to said first and second delayed differential signal outputs: and a variable hysteresis stage, said variable hysteresis stage following said differential stage and controlling signal delay in said variable delay buffer unit, said variable hysteresis stage connected between said first and second differential stage outputs and said first and second delayed differential signal outputs, said variable hysteresis stage having a first recovery transistor connected between said first delayed differential signal output and a first variable current source, a gate of said first recovery transistor being connected to said second differential stage output, and a second recovery transistor connected between said second delayed differential signal output and a second variable current source, a gate of said second recovery transistor being connected to said first differential stage output.

2. The buffer according to claim 1 wherein said first and second variable current sources are formed by a current source transistor connected between said recovery transistors and first voltage supply a gate of said current supply transistor being connected to receive a delay control signal.

3. The buffer according to claim 2, wherein said first and second variable current sources are formed by a common first current source transistor.

4. A differential variable delay buffer, comprising:

a variable delay buffer unit, wherein said variable delay buffer unit comprises;

a differential stage, said differential stage comprises a first comparator transistor having a gate connected to a first differential signal input and a second comparator transistor having a gate connected to a second differential signal input, said first comparator transistor being connected via a second current source transistor to a second voltage supply, said second comparator transistor being connected via a third current source transistor to said second voltage supply and said first and second comparator transistors being connected via a fourth current source transistor to a first voltage supply; and a variable hysteresis stage, said variable hysteresis stage following said differential stage and controlling signal delay in said variable delay buffer unit.

5. The buffer according to claim 2, wherein said first voltage supply is a 0 volt supply line.

* * * * *